United States Patent
Yoon

(10) Patent No.: US 7,371,618 B2
(45) Date of Patent: May 13, 2008

(54) METHOD OF MANUFACTURING WAFER-LEVEL CHIP-SIZE PACKAGE AND MOLDING APPARATUS USED IN THE METHOD

(75) Inventor: Tae-Sung Yoon, Cheonan-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 186 days.

(21) Appl. No.: 10/842,523

(22) Filed: May 11, 2004

(65) Prior Publication Data
US 2005/0048693 A1 Mar. 3, 2005

(30) Foreign Application Priority Data
Aug. 28, 2003 (KR) .................. 10-2003-0059832

(51) Int. Cl.
*H01L 21/50* (2006.01)
*H01L 21/48* (2006.01)
*H01L 21/44* (2006.01)
*H01L 23/28* (2006.01)
*H01L 23/29* (2006.01)
*H01L 23/544* (2006.01)
*H01L 21/78* (2006.01)

(52) U.S. Cl. ............... 438/127; 438/106; 438/110; 438/613; 438/113; 257/787; 257/788; 257/E21.599; 257/E23.124; 257/620

(58) Field of Classification Search ........... 438/110, 438/113, 115, 613, 666, 127, 106; 257/620, 257/787, 788, E21.599, E23.124
See application file for complete search history.

(56) References Cited

U.S. PATENT DOCUMENTS 5,424,250 A * 6/1995 Sawada .................. 438/127
5,641,997 A * 6/1997 Ohta et al. ............... 257/788
5,733,802 A * 3/1998 Inoue et al. .............. 438/127
6,224,360 B1 * 5/2001 Miyajima ................. 425/89
6,326,235 B1 * 12/2001 Glenn ...................... 438/106
6,350,668 B1 * 2/2002 Chakravorty ............. 438/612

(Continued)

FOREIGN PATENT DOCUMENTS

JP 09-219421 8/1997

(Continued)

OTHER PUBLICATIONS

Korean Office Action Jul. 7, 2005 for Korean Application No. 2003-0059832 (Complete English translation provided).

*Primary Examiner*—Luan Thai
(74) *Attorney, Agent, or Firm*—Harness, Dickey & Pierce, P.L.C.

(57) ABSTRACT

Provided are a method of manufacturing wafer-level chip-size packages and a molding apparatus suitable for practicing the method whereby a semiconductor wafer having a plurality of semiconductor chips formed thereon may be encapsulated. The semiconductor wafer, typically with a plurality of conductive bumps extending from the semiconductor chips, will be placed in a cavity formed between upper and lower molds. Injection molding of an encapsulant composition or compression molding of encapsulant sheets may then be used to apply encapsulating layers to the upper and lower surfaces of the semiconductor wafer in a substantially simultaneous manner, thereby reducing the likelihood of warping and mechanical damage to the semiconductor wafer. The wafer-level chip-size packages can then be separated from the encapsulated semiconductor wafer.

6 Claims, 5 Drawing Sheets

U.S. PATENT DOCUMENTS

| | | | |
|---|---|---|---|
| 6,469,399 B2 * | 10/2002 | Fang et al. | 257/797 |
| 6,717,245 B1 * | 4/2004 | Kinsman et al. | 257/678 |
| 6,881,611 B1 * | 4/2005 | Fukasawa et al. | 438/114 |
| 2003/0020183 A1 | 1/2003 | Bai | |

FOREIGN PATENT DOCUMENTS

| | | |
|---|---|---|
| KR | 2002-0076838 | 10/2002 |

* cited by examiner

METHOD OF MANUFACTURING WAFER-LEVEL CHIP-SIZE PACKAGE AND MOLDING APPARATUS USED IN THE METHOD

CROSS-REFERENCE TO RELATED APPLICATION

This application claims priority from Korean Patent Application No. 03-59832, which was filed on 28 Aug. 2003 in the Korean Intellectual Property Office, the disclosure of which is incorporated herein in its entirety by reference.

BACKGROUND OF THE INVENTION

1. Field of the Invention

The present invention relates to a method of manufacturing a semiconductor package, and a molding apparatus used in the method, and more particularly, to a method of manufacturing a wafer-level chip-size package, and a molding apparatus used in the method.

2. Description of the Related Art

In keeping with the trend toward miniaturization in the development of electronic devices, i.e., the trend toward making ever smaller and ever thinner packages, wafer-level chip-size packages. Such packages, which are about the same size as the incorporated semiconductor chips and which are substantially complete before being separated from the wafer, have been the subject of increasing interest. During the manufacture of a wafer-level chip-size package, typically both a rewiring process and an encapsulating process are performed while the chips remain in a wafer state, after which the individual chip packages are separated from the wafer using a dicing process.

If a thin wafer is used for making a wafer-level chip-size package, the wafer tends to have insufficient strength and is more susceptible to deformation such as bending and/or warping. Both the likelihood and seriousness of such wafer warping formation tends to increase as the diameter of the wafer increases. Similar problems are associated with larger semiconductor chip geometries which may experience or be susceptible to chip warping. Both wafer warping and/or chip warping are detrimental to the fabrication process and tend to decrease the overall process yield and may degrade the quality and reliability of the wafer-level chip-size packages that are produced.

In particular, conventional wafer-level chip-size packages are susceptible to wafer warping because only the front surface of the wafer is molded using an encapsulant. Further, when a wafer is molded only on its front surface, the edges of chips of the wafer may be more susceptible to cracking or chipping during the subsequent dicing processing and associated handling. Moreover, conventional wafer-level chip-size packages having and encapsulant layer provided only on the front surface tend to be more susceptible to semiconductor chip cracking resulting from impacts associated with the handling during subsequent wafer level testing, board mounting processes and package test processes.

SUMMARY OF THE INVENTION

The present invention provides exemplary methods of manufacturing a wafer-level chip-size package that may exhibit increased resistance to wafer warping and semiconductor chip edge cracking.

The present invention also provides an exemplary molding apparatus that can be used for manufacturing a wafer-level chip-size package.

An exemplary embodiment of a manufacturing method according to the present invention provides a method of manufacturing a wafer-level chip-size package including preparing a wafer having a lower surface and a plurality of semiconductor chips on an upper surface, the semiconductor chips including conductive bumps on their upper surface; molding the upper and lower surfaces of the wafer at the same time using an encapsulant; exposing upper surfaces of the conductive bumps by removing an upper portion of the encapsulant; forming terminals on the exposed surfaces of the conductive bumps; and separating the wafer into individual wafer-level chip-size packages.

The wafer including the plurality of semiconductor chips and having conductive bumps on its upper surface may be formed after preparing a wafer comprising a plurality of semiconductor chips having input/output pads, by forming the conductive bumps on the input/output pads of the semiconductor chips. The molding of the upper and lower surfaces of the wafer using an encapsulant may be performed using either an injection molding method or a compression molding method.

If an injection molding method is used to mold the upper and lower surfaces of the wafer, the injection molding method may include: tightly contacting a releasing film to a lower mold and an upper mold of a molding apparatus; loading the wafer having the plurality of conductive bumps between the lower mold and the upper mold; injecting the encapsulant between the lower mold and the upper mold; heating the upper and/or lower molds while closed to cure, at least partially, the injected encapsulant or cooling an encapsulant melt to solidify the encapsulant; and separating the wafer from the upper and lower molds using the releasing film. The wafer molded using the encapsulant may be subjected to a post-molding heat treatment after being separated from the upper and lower molds. The encapsulant utilized in the injection molding method may be a liquid encapsulant or a solid encapsulant.

If a compression molding method is used to mold the upper and lower surfaces of the wafer, the compression molding method may include: contacting a releasing film tightly to the lower mold and the upper mold of the molding apparatus; placing encapsulant sheets on the tightly contacted releasing film; placing the wafer between the encapsulant sheets; thermally compressing the encapsulant sheets onto the upper and lower surfaces of the wafer by pressing the upper and lower molds together; curing the upper and lower molds together with the encapsulant; and separating the wafer from the upper and lower molds using the releasing film. The encapsulant sheets that may be used in the compression molding method may include one or more materials such as polyimide, epoxy and silicon.

In accordance with another aspect of the present invention, there is provided an exemplary molding apparatus useful for manufacturing wafer-level chip-size packages. The exemplary molding apparatus includes: a lower mold support where a lower mold is located; a mold moving control unit, located under the lower mold, that moves the lower mold and the lower mold support; an upper mold support that supports an upper mold that faces the lower mold; an encapsulant injection unit that injects an encapsulant between the lower mold and the upper mold; and a temperature control unit that controls the temperature of the lower mold.

An exemplary mold moving control unit may include: a supporting unit that supports the lower mold; and a hydraulic pump that moves the lower mold and the lower mold support upward. An exemplary encapsulant injection unit may include: an encapsulant injection controller that controls an injection speed and quantity of the encapsulant; an air tube connected to the encapsulant injection controller; an encapsulant source connected to the air tube; and an injection needle that injects the encapsulant between the lower mold and the upper mold. An exemplary temperature control unit may include: a heat controller that controls a temperature of the lower mold; and a heat pipe that connects the heat controller to the lower mold.

According to the present invention, since the lower and upper surfaces of a wafer are molded at the same time using an encapsulant, warping of even thin and large wafers can be reduced or eliminated, and occurrence of cracking at the edges of semiconductor chips resulting from impacts during subsequent handling can also be reduced or prevented.

BRIEF DESCRIPTION OF THE DRAWINGS

The above and other features and advantages of the present invention will become more apparent by describing exemplary embodiments of the manufacturing method and manufacturing apparatus in detail with reference to the attached drawings, in which.

Figure 1:
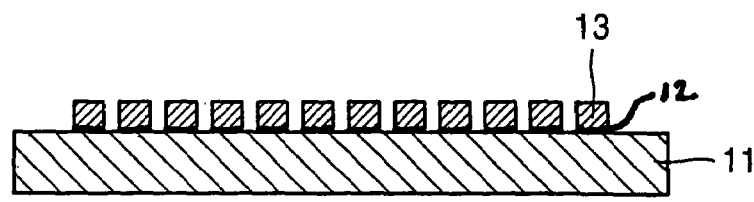
FIGS. 1 through 5 are cross-sectional views illustrating certain steps in and intermediate structures produced by an exemplary embodiment of a method of manufacturing a wafer-level chip-size package according to the present invention.

These drawings have been provided to assist in the understanding of the exemplary embodiments of the invention as described in more detail below and should not be construed as unduly limiting the invention. In particular, the relative spacing, sizing and dimensions of the various elements illustrated in the drawings are not drawn to scale and may have been exaggerated, reduced or otherwise modified for the purpose of improved clarity.

DETAILED DESCRIPTION OF EXEMPLARY EMBODIMENTS

Hereinafter, exemplary embodiments of the present invention will be described more fully with reference to the accompanying drawings. This invention may, however, be embodied in many different forms and should not be construed as being limited to the embodiments set forth herein. Rather, these embodiments are provided so that this disclosure is thorough and complete and fully conveys the concept of the invention to those skilled in the art. In the drawings, identical reference numerals denote the same or corresponding elements.

FIGS. 1-5 are cross-sectional views of an exemplary method of manufacturing a wafer-level chip-size package according to an embodiment of the present invention. As illustrated in FIG. 1, a wafer 11 comprising a plurality of semiconductor chips (not shown) and a plurality of conductive bumps 13 on its upper surface, may be prepared by any conventional and/or proprietary methods. In most instances, a plurality of semiconductor chips, each having a plurality of input/output pads, will be formed on the upper surface of the semiconductor wafer 11. After the input/output pads have been formed, a corresponding plurality of conductive bumps are formed on the input/output pads. In most instances, each conductive bump 13 will be in direct electrical connection with at least one input/output pad of a semiconductor chip. The height of the conductive bumps 13 may be varied within a broad range, but a nominal height of approximately 100 μm is typically adequate.

Figure 2:
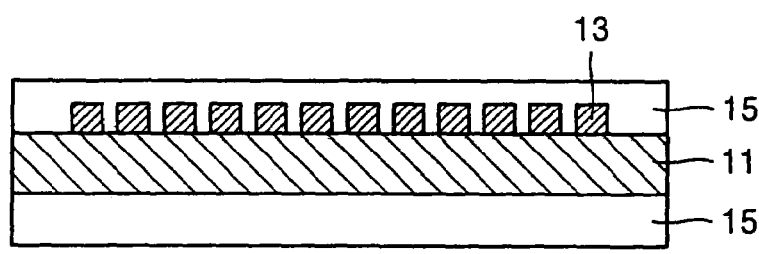

As illustrated in FIG. 2, both the upper and lower surfaces of the wafer 11 having the conductive bumps 13 are then molded using an encapsulant 15. The molding of the upper surface of the wafer 11, having the conductive bumps, is performed substantially simultaneously with the molding of the lower surfaces of the wafer 11, rather than sequentially. Because the upper and lower surfaces of the wafer 11 are molded with encapsulant at the same time, both surfaces are subjected to substantially equivalent thermal stresses and mechanical forces. This general balancing of the stresses and forces applied to the opposite sides of the wafer 11 will tend to reduce the likelihood of wafer warping, even in applications in which the wafer is thin and/or wide. In addition, because both of the wafer surfaces are molded with and protected by an encapsulant layer, cracking of the edges of semiconductor chips due to impact during subsequent handling of the wafer 11 associated with wafer level testing, board mounting processes and package test processes, can be reduced or prevented. The substantially simultaneous molding of the upper and lower surfaces of the wafer 11 may be performed using an injection molding method, a compression molding method or a combination thereof.

Figure 3:
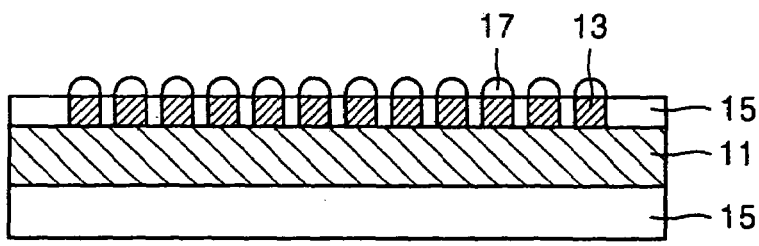

As illustrated in FIG. 3, an upper portion of the encapsulant layer 15 formed on the upper surface of the wafer 11 may then be removed, typically by grinding or polishing, to expose upper surfaces of the conductive bumps 13. Afterward, a plurality of terminals 17 may be formed on the exposed surfaces of the conductive bumps 13. The terminals 17 may be formed by depositing solder balls or solder paste on the upper surfaces of the conductive bumps 13 and then reflowing the solder to complete formation of the terminals. Once the terminals 17 have been formed, the individual semiconductor chips may be subjected to functional and/or parametric testing to identify known good die and/or classify the relative performance of the semiconductor chips.

Figure 4:
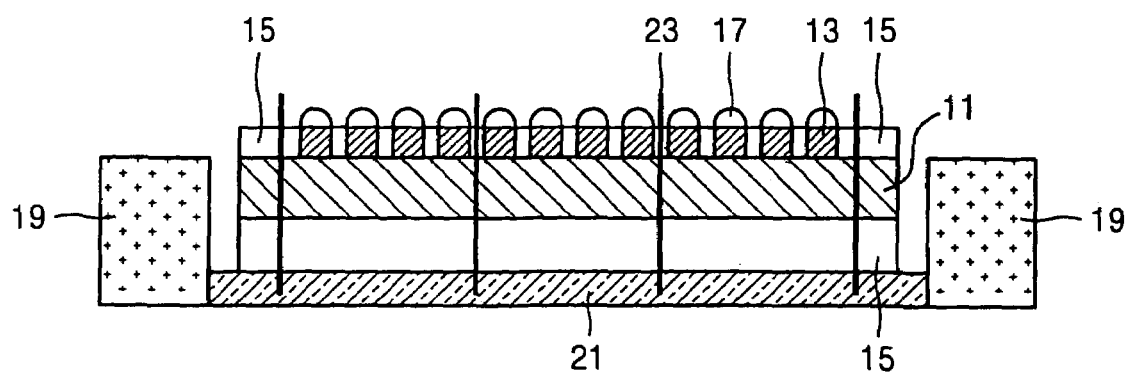
Figure 5:
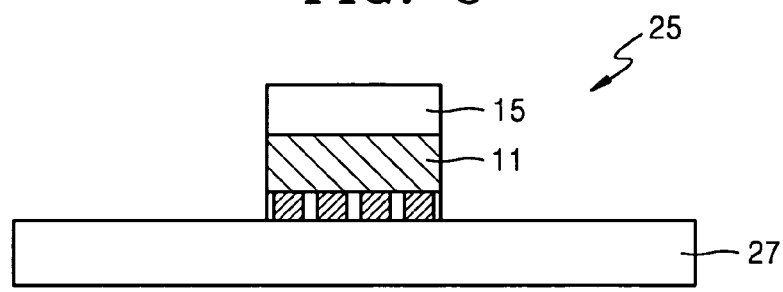

As illustrated in FIG. 4, typically after the wafer-level testing has been completed, the wafer 11 may then be diced to separate the encapsulated wafer into individual semiconductor packages 25 that each contain one or more of the semiconductor chips that had been formed on the wafer 11. As shown in FIG. 4, the wafer 11 having the terminals 17 may be attached to an adhesive tape 21 or mounted on a vacuum chuck or some other holding device (not shown), which is supported by a wafer frame 19 or other structure. The supported wafer 11 may then be cut or diced along cutting lines 23 provided between adjacent individual semiconductor chips to separate the wafer into individual semiconductor packages 25, that may, as illustrated in FIG. 5, be mounted on a board 27 or other mounting substrate for operation in an electronic device, assembly or subassembly.

Figure 6:
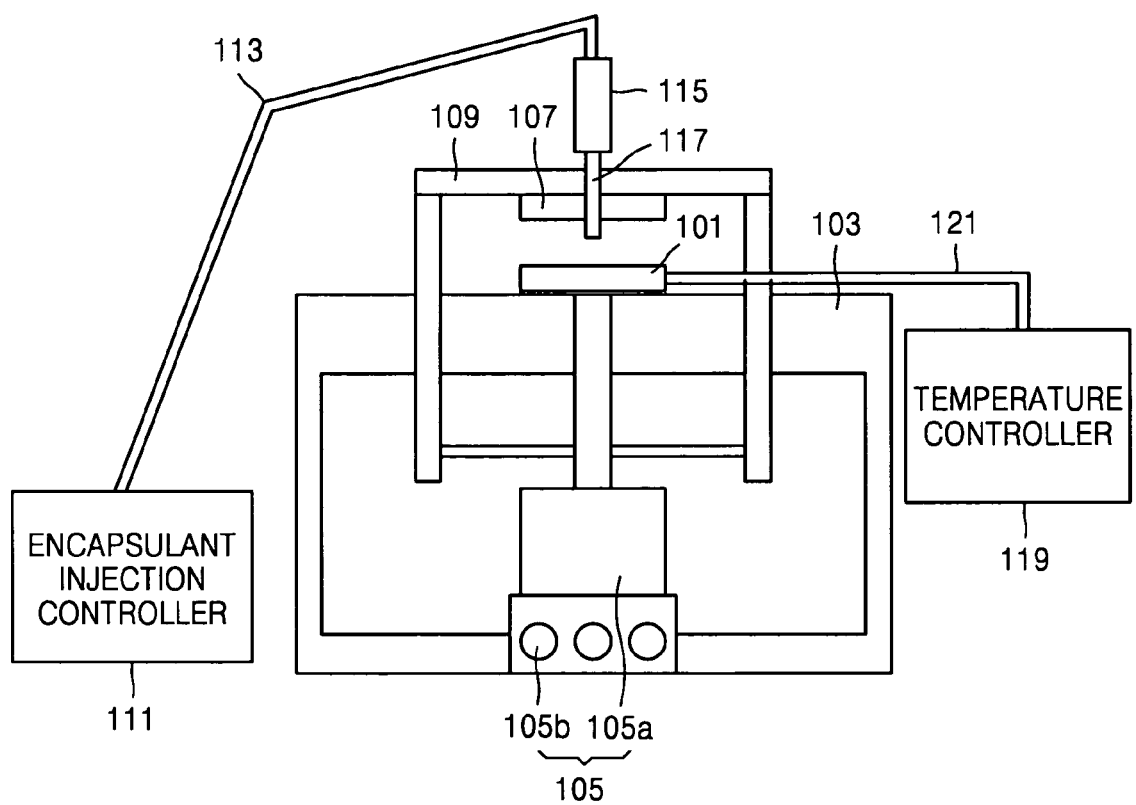
FIG. 6 is a schematic diagram of an exemplary molding apparatus used for manufacturing a wafer-level chip-size package according to the present invention.

FIG. 6 is a schematic diagram of an exemplary embodiment of a molding apparatus used for manufacturing a wafer-level chip-size package according to the present invention. The molding apparatus shown in FIG. 6 may be used for both injection molding and compression molding. For injection molding, a liquid state or solid state encapsulant may be used, and for compression molding, an encapsulant sheet is used.

As illustrated in FIG. 6, the molding apparatus comprises a lower mold support 103 on which a lower mold 101 is located, and a mold moving control unit 105 connected to the lower mold 101 for moving the lower mold 101 and the lower mold support 103 upward. The exemplary mold moving control unit 105 includes a supporting unit 105a for supporting the lower mold 101 and moving the lower mold 101 and the lower mold support 103 upward, and a pump set 105b or other means suitable for applying a vacuum at the surfaces of the lower mold 101 and an upper mold 107. As will be appreciated, a variety of actuating assemblies may be utilized for moving the supporting unit 105a and its supported lower mold 101 relative to the upper mold 107, including one or more hydraulic, pneumatic, electric and magnetic elements. The exemplary molding apparatus also comprises an upper mold support 109 for supporting the upper mold 107, which faces the lower mold support 103 supporting the lower mold 101. The exemplary molding apparatus further includes an encapsulant injection unit, 111, 113, 115, and 117, for injecting the encapsulant into the opening formed between the upper mold 107 and the lower mold 101.

An exemplary encapsulant injection unit includes: an encapsulant injection controller 111 for controlling the injection speed and quantity of the encapsulant, an air tube 113 connected to the encapsulant injection controller 111, an encapsulant source unit 115 connected to the air tube 113, and an injection needle 117 connected to the encapsulant source 115 for injecting the encapsulant between the upper mold 107 and the lower mold 101. The encapsulant source unit 115 is designed to use a liquid encapsulant, but when a solid encapsulant such as solid EMC is used, a heating device (not shown) can be provided on the encapsulant source unit 115. Although, as illustrated in FIG. 6, the injection needle 117 enters the opening through the upper mold 107, it will be appreciated that other embodiments may provide one or more injection needle(s) 117 inserted through the lower mold, or may include a plurality of injection needles communicating with the opening through both the upper mold and the lower mold.

In addition, the exemplary molding apparatus as illustrated in FIG. 6 comprises a temperature control unit, 119, 121, for controlling the temperature of the lower mold 101. An exemplary temperature control unit will include both a temperature controller 119 for controlling the temperature of the lower mold 101, and a heat pipe 121 or power supply (not shown) controlled by the temperature controller 119 for heating the lower mold 101 as necessary.

Figure 7A:
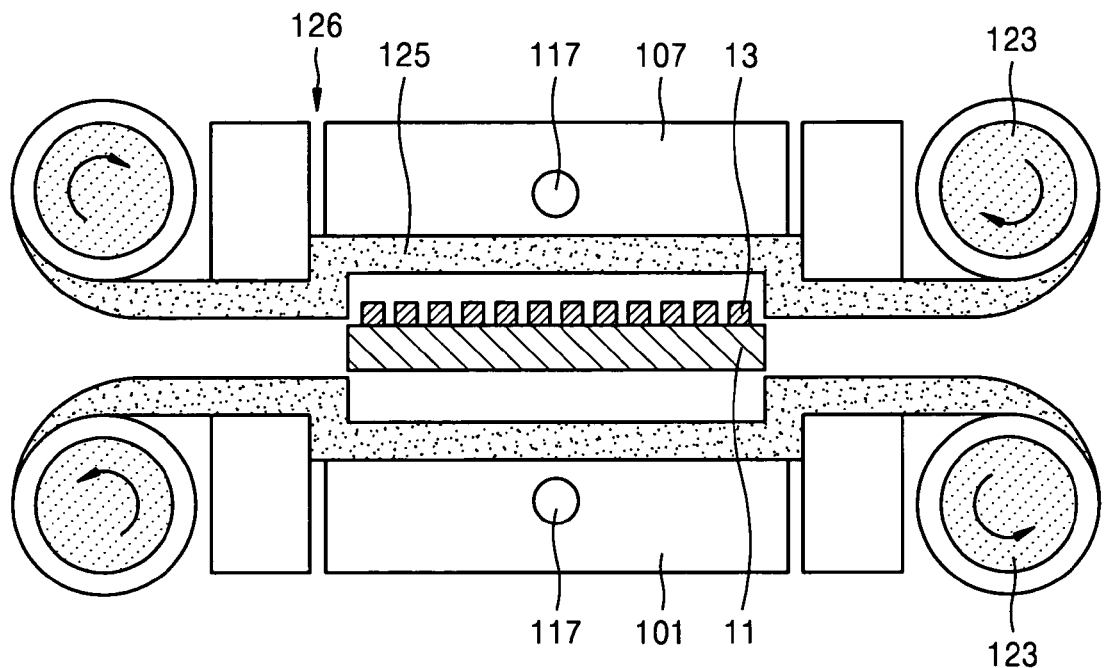
FIGS. 7A through 7C show a molding process of an encapsulant depicted in FIG. 2, performed by the molding apparatus depicted in FIG. 6.
Figure 7B:
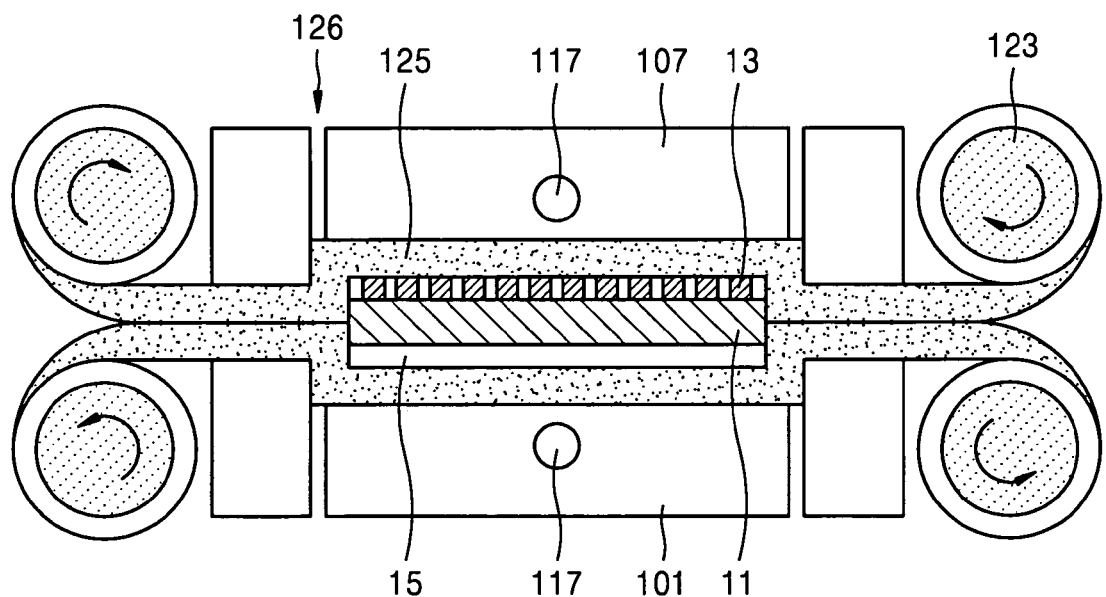
Figure 7C:
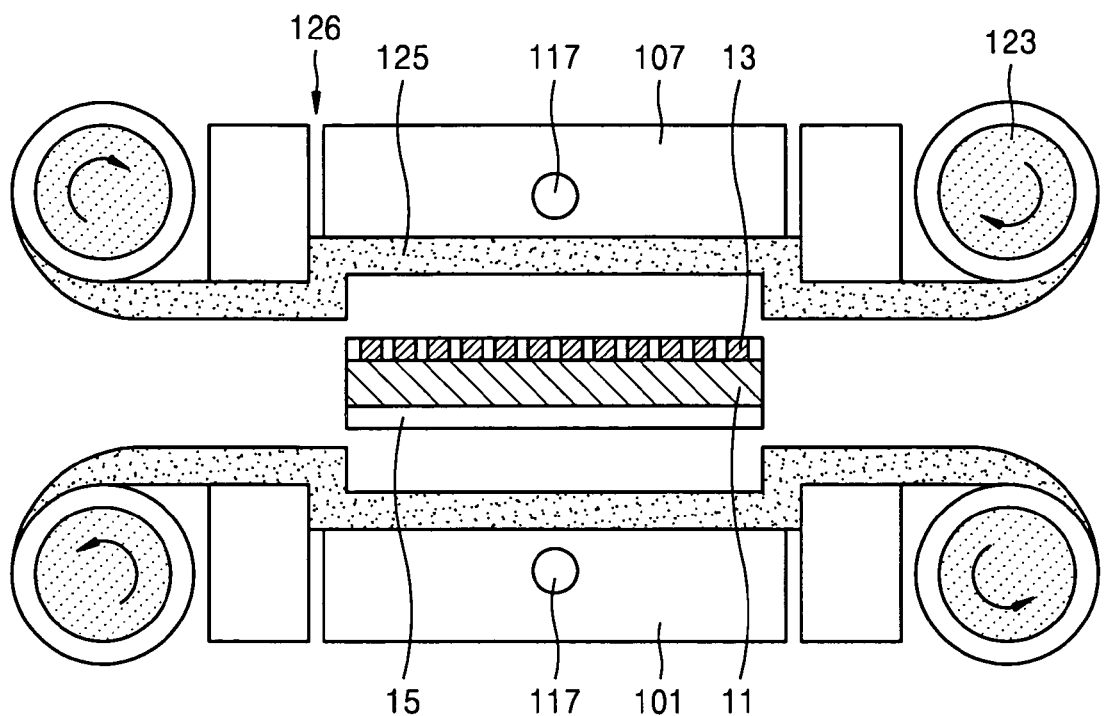

FIGS. 7A-C illustrate an exemplary embodiment of an encapsulant molding process for producing a structure generally corresponding to FIG. 2, using an exemplary molding apparatus as generally depicted in FIG. 6. More specifically, FIGS. 7A-C show an encapsulant molding process according to an exemplary embodiment of an injection molding method according to the present invention.

As shown in FIG. 7A, a tape roller 123 or other supply means is provided adjacent the upper mold 107 and the lower mold 101 for supplying a releasing film 125 to the molds. A releasing film 125 is then arranged across the opposing faces of the upper mold 107 and the lower mold 101 and a wafer 11 having conductive bumps 13 is positioned between the releasing films provided on the upper and lower molds 107, 101. As depicted in FIG. 7A, the releasing films 125 may be arranged to contact the upper mold 107 and lower mold 101 very closely, by suction created at vacuum holes 126 using the pump set 105b or other vacuum source, by "sealing" peripheral portions of the releasing films and increasing the pressure between the films to tend to force them against the respective mold faces or by any other suitable means. After the encapsulated wafer has been removed, the same releasing film 125 or a new section of releasing film 125 can be used with the next wafer.

Next, as shown in FIG. 7B, an encapsulant, i.e., a liquid resin, is injected through injection needle 117 into the space formed between the upper mold 107 and the lower mold 101 that contains the wafer 11. When injection has been completed and the cavity containing the wafer 11 has been substantially filled with the encapsulant 15, the lower mold 101 and/or the upper mold 107 may be heated in order to cure the encapsulant 15.

When curing has been completed or has progressed sufficiently to render the encapsulant generally solid, as shown in FIG. 7C, the upper mold 107 and the lower mold 101 are separated and the encapsulated wafer 11 removed from the mold. The encapsulated wafer 11 and the encapsulant 15 may then be subjected to additional post-molding processing such as heat treatment to finish curing the encapsulant or otherwise complete the molding process.

When, using the configuration shown in FIG. 7B, the encapsulant utilized is a normally solid composition, the encapsulant may be heated to form a melt or a flowable semi-solid that may then be injected through injection needle 117 into the space formed between the upper mold 107 and the lower mold 101 that contains the wafer 11. When injection has been completed and the cavity containing the wafer 11 has been substantially filled with the encapsulant 15, the lower mold 101 and/or the upper mold 107 may be cooled in order to solidify the injected encapsulant 15.

Figure 8A:
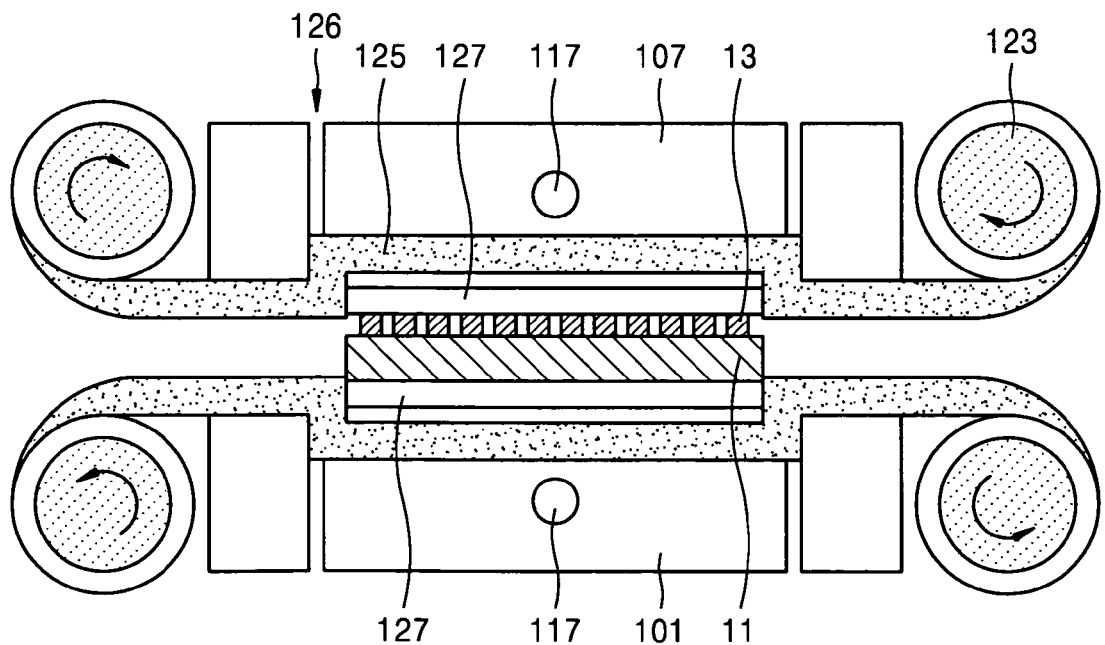
FIGS. 8A through 8C show another molding process of an encapsulant depicted in FIG. 2, performed by the molding apparatus depicted in FIG. 6.
Figure 8B:
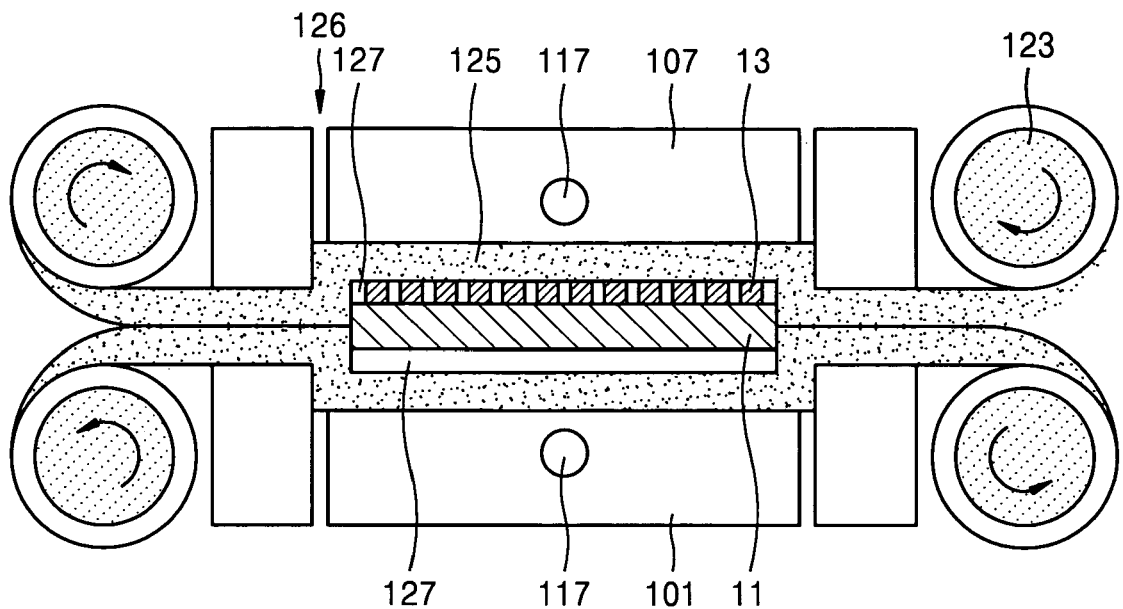
Figure 8C:
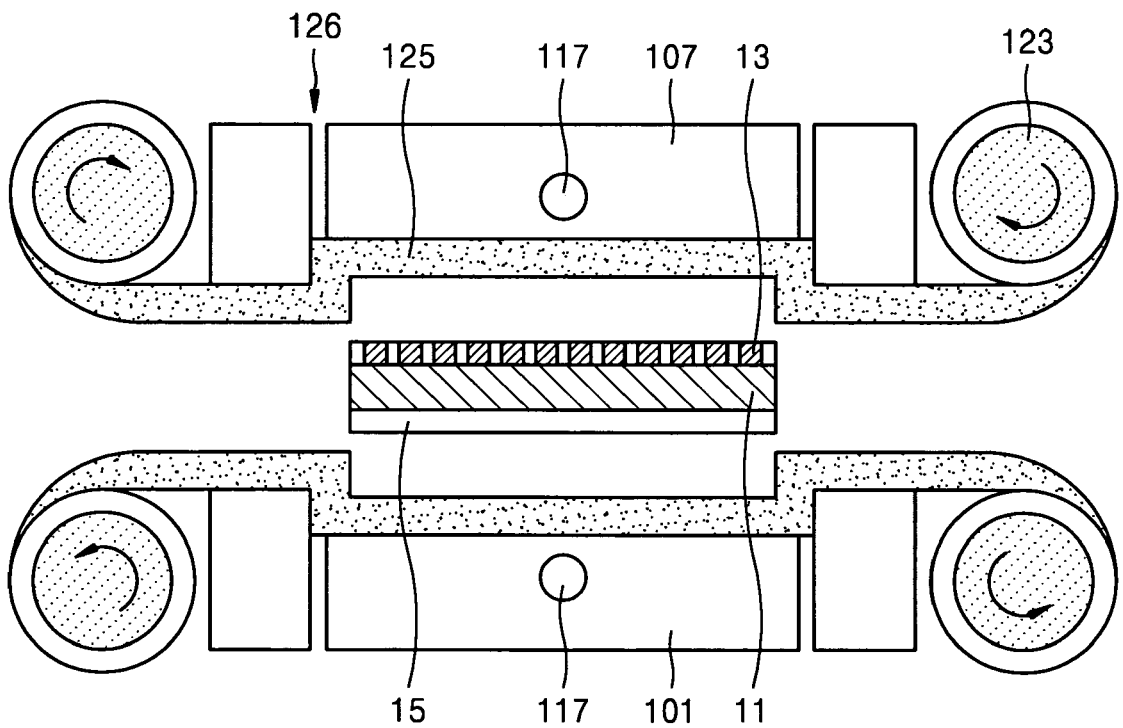

FIGS. 8A-C show another exemplary embodiment of an encapsulant molding process for producing structure generally corresponding to FIG. 2, using molding apparatus generally corresponding to FIG. 6. More specifically, FIGS. 8A-C show an encapsulant molding process using a compression molding method.

As illustrated in FIG. 8A, a tape roller 123 or other dispensing means may be provided adjacent each of the upper mold 107 and the lower mold 101 from which a releasing film 125 may be applied to the opposing faces of the molds. As depicted in FIG. 8A, the releasing films 125 may be made to contact or conform very closely to the opposing surfaces the upper mold 107 and lower mold 101 very closely by, for example, applying a vacuum to the releasing films through vacuum holes 126 using the pump set 105b or other vacuum source. Encapsulant sheets 127 may then be applied to selected portions of the releasing films 125 after which a wafer 11 may be arranged between the encapsulant sheets. Alternatively an encapsulant sheet 127 may be provided on the upper and/or lower surfaces of the wafer 11 before the wafer is placed between the molds. The encapsulant sheets 127 may include one or more materials selected from the group consisting of polyimide, epoxy and silicon. Then, as illustrated in FIG. 8B, the molds 101, 107 are forced together and typically heated so that encapsulant sheets 127 will be thermally compressed onto the upper and lower surfaces of the wafer 11. The heating and pressure within the mold may be sufficient to cure the encapsulant sheets 127 or additional post-molding processing may be necessary to complete the encapsulation process. Once bonded to the surfaces of the wafer 11, the encapsulant sheets 127 become encapsulant layers 15.

As illustrated in FIG. 8C, once the encapsulant sheets 127 are sufficiently bonded to the surfaces of the wafer 11, the upper mold 107 and the lower mold 101 may be separated and the encapsulated wafer 11 removed from the mold. As with the use of liquid encapsulants described above, the encapsulated wafer 11 may be subjected to some post-molding processes, such as additional heat treatment, to complete the molding process.

As described above, in the method of manufacturing a wafer-level chip-size package according to the present invention, since both upper and lower surfaces of the wafer are molded with an encapsulant at the same time, warping of thin and/or large wafers can be prevented, and semiconductor chips are protected from cracking resulting from impacts incurred during subsequent handling in wafer level testing, board mounting processes and package testing.

In addition, the molding apparatus used for manufacturing a wafer-level chip-size according to the present invention can mold a wafer using either injection molding, compression molding or a combination of injection and compression molding. Therefore, the molding apparatus according to the present invention can use a liquid encapsulant, a solid encapsulant, or encapsulant sheets.

While this invention has been particularly shown and described with reference to exemplary embodiments thereof, it will be understood by those skilled in the art that various changes in form and details may be made therein without departing from the spirit and scope of the invention as defined by the appended claims.

What is claimed is:

1. A method of manufacturing a wafer-level chip-size package comprising:
   preparing a semiconductor wafer having an upper surface and a lower surface, the upper surface including an array of semiconductor devices and a plurality of conductive bumps extending from the semiconductor devices;
   encapsulating the upper surface and the conductive bumps in a first encapsulant layer and encapsulating the lower surface in a second encapsulant layer, the encapsulation of the upper and lower surfaces occurring substantially simultaneously, wherein encapsulating the upper and lower surfaces of the semiconductor wafer is achieved by injection molding and includes providing a releasing film on an upper surface of a lower mold, providing a releasing film on a lower surface of an upper mold, positioning the semiconductor wafer between the lower mold and the upper mold, closing the lower mold and the upper mold to form a mold cavity containing the semiconductor wafer, injecting the encapsulant into the mold cavity, curing the injected encapsulant to form an encapsulated semiconductor wafer, opening the mold, and removing the encapsulated semiconductor wafer from the mold; and
   removing an upper portion of the first encapsulant layer to form a substantially planar surface exposing upper surfaces of the conductive bumps.

2. A method of manufacturing a wafer-level chip-size package according to claim 1, further comprising:
   forming terminals on the exposed conductive bumps; and
   separating an individual wafer-level chip-size package from the semiconductor wafer.

3. A method of manufacturing a wafer-level chip-size package according to claim 1, wherein:
   each of the semiconductor devices includes a plurality of input/output pads with each of the input/output pads being electrically connected to a corresponding conductive bump.

4. A method of manufacturing a wafer-level chip-size package according to claim 3, wherein:
   the conductive bumps are formed directly on the input/output pads.

5. A method of manufacturing a wafer-level chip-size package according to claim 1, further comprising:
   subjecting the encapsulated semiconductor wafer to a post-molding heat treatment after removing the encapsulated semiconductor wafer from the mold.

6. A method of manufacturing a wafer-level chip-size package according to claim 1, wherein:
   the encapsulant injected into the cavity is selected from a group consisting of liquid encapsulants, semi-solid material encapsulants and solid encapsulants.

* * * * *